(12) United States Patent  
Waheed et al.

(10) Patent No.: US 9,350,296 B1
(45) Date of Patent: May 24, 2016

(54) SYSTEMS AND METHODS FOR CALIBRATING A DUAL PORT PHASE LOCKED LOOP

(71) Applicant: FREESCALE SEMICONDUCTOR, INC., Austin, TX (US)

(72) Inventors: Khurram Waheed, Austin, TX (US); Chris N. Stoll, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/604,428

(22) Filed: Jan. 23, 2015

(51) Int. Cl.  
*H03C 3/09* (2006.01)  
*H03C 3/04* (2006.01)

(52) U.S. Cl.  
CPC ............. *H03C 3/0991* (2013.01); *H03C 3/04* (2013.01); *H03C 3/095* (2013.01); *H03C 3/0941* (2013.01); *H03C 2200/005* (2013.01); *H03C 2200/0041* (2013.01)

(58) Field of Classification Search  
CPC ...... H03C 3/0991; H03C 3/0941; H03C 3/06; H03C 3/095; H03C 3/08; H03C 2200/0041; H03C 2200/005; H03C 2200/0079; H03C 2200/0083  
USPC .................................. 332/128, 124, 123, 127  
See application file for complete search history.

(56) References Cited

U.S. PATENT DOCUMENTS

| | | | |
|---|---|---|---|
| 6,072,426 A | 6/2000 | Roos | |
| 6,515,553 B1 | 2/2003 | Filiol et al. | |
| 7,012,470 B2 * | 3/2006 | Suzuki | H03C 3/0958 331/16 |
| 7,053,727 B2 | 5/2006 | Nilsson | |
| 7,148,760 B2 | 12/2006 | Vaananen | |
| 7,183,860 B2 | 2/2007 | Staszewski et al. | |
| 7,289,004 B2 | 10/2007 | Chan et al. | |
| 7,365,609 B2 | 4/2008 | Waheed et al. | |
| 7,466,207 B2 | 12/2008 | Staszewski et al. | |
| 7,612,617 B2 | 11/2009 | Pullela et al. | |
| 7,902,891 B1 * | 3/2011 | Miyanaga | H03C 3/0941 327/149 |
| 8,384,450 B2 * | 2/2013 | Kuramochi | H03C 3/0925 327/147 |
| 8,704,602 B2 | 4/2014 | Miyanaga et al. | |
| 2012/0326795 A1 | 12/2012 | Chiu et al. | |

* cited by examiner

*Primary Examiner* — Ryan Johnson

(57) ABSTRACT

The present disclosure provides for a phase-locked loop (PLL) that includes a high-port calibration control module configured to calibrate an input modulation value of a voltage-controlled oscillator (VCO) to a first modulation value that results in an output signal of the VCO having a positive frequency change from an initial output frequency, and capture a positive frequency value of the output signal after a first accumulation time period. The high-port calibration control module is also configured to calibrate the input modulation value of the VCO to a second modulation value that results in the output signal having a negative frequency change from the initial output frequency, capture a negative frequency value of the output signal after a second accumulation time period, and calculate a calibration scale factor based on a difference between the positive and negative frequency values.

17 Claims, 5 Drawing Sheets

SYSTEMS AND METHODS FOR CALIBRATING A DUAL PORT PHASE LOCKED LOOP

BACKGROUND

1. Field

This disclosure relates generally to phase locked loops, and more specifically, to calibrating a dual port modulation phase locked loop.

2. Related Art

Phase locked loops (PLLs) with dual port modulation are widely used in radio frequency transceivers when the required frequency modulation far exceeds the PLL loop bandwidth. In a 2.4 GHz band, for example, most communication deployments/standards typically use a frequency deviation in the range of 10's-100's of kHz (i.e., Zigbee: ±500 kHz; Bluetooth low energy (BLE): up to ±250 kHz, etc.) at a modulation injection rate that is a multiple of the baseband symbol rate. For example, Zigbee has a chip rate of 2 MHz and BLE has a symbol rate of 1 MHz, but the input to the PLL may be applied at a reference clock derived rate (e.g., 16-48 MHz)). The wide modulation bandwidth necessitates the use of dual port modulation, which enables the PLL modulation rate to be independent of the PLL loop bandwidth, while requiring a very high stability of the channel frequency. The high stability requirement places an upper limit on the PLL loop bandwidth due to several noise sources in a PLL-based RF frequency generation.

In a dual port modulation PLL, the bulk of the modulation is directly injected into a voltage controlled oscillator (VCO) via a high port, where the modulation is scaled by the instantaneous VCO capacitance (or varactor control voltage) to frequency transfer function.

VCO modulation command to VCO output frequency deviation gain (Kmod) is a function of frequency (or tank capacitance) as well as process, voltage and temperature (PVT) variations. To make the VCO direct modulation immune to the non-linearity of the instantaneous VCO capacitance-to-frequency transfer function as well as to avoid accuracy variation over PVT variations, the high port modulation can be realized using a bank of very fine quantized digitally switchable varactors (with a capacitance in atto-Farads). In such an arrangement, the digital modulation can be realized accurately, if the frequency step size (or Kmod) of a high port varactor is precisely known, so that the number of varactors needed to realize a frequency modulation command can be accurately calculated. For modern connectivity standards, the transmitter modulation performance requirements imply better than 1-2% nominal accuracy on the estimation of the Kmod gain under nominal conditions, but needs to be better than 5% in the worst case conditions.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed to estimate and calibrate the voltage controlled oscillator (VCO) modulation bank least significant bit (LSB) to frequency gain in a phase locked loop (PLL) using a robust two step modulation measurement approach. High port modulator (HPM) calibration is performed before each transmission or series of transmissions to determine the value of the VCO modulation frequency gain at the transmit frequency or frequencies and the active process, voltage and temperature (PVT) conditions. The HPM calibration factor is determined in two-steps by setting a HPM capacitor array to positive and negative frequency values and measuring frequency response of the transmitter at each value for a period of time. The resulting difference between the positive and negative frequency points is used in a lookup table to determine a HPM calibration factor.

Figure 1:
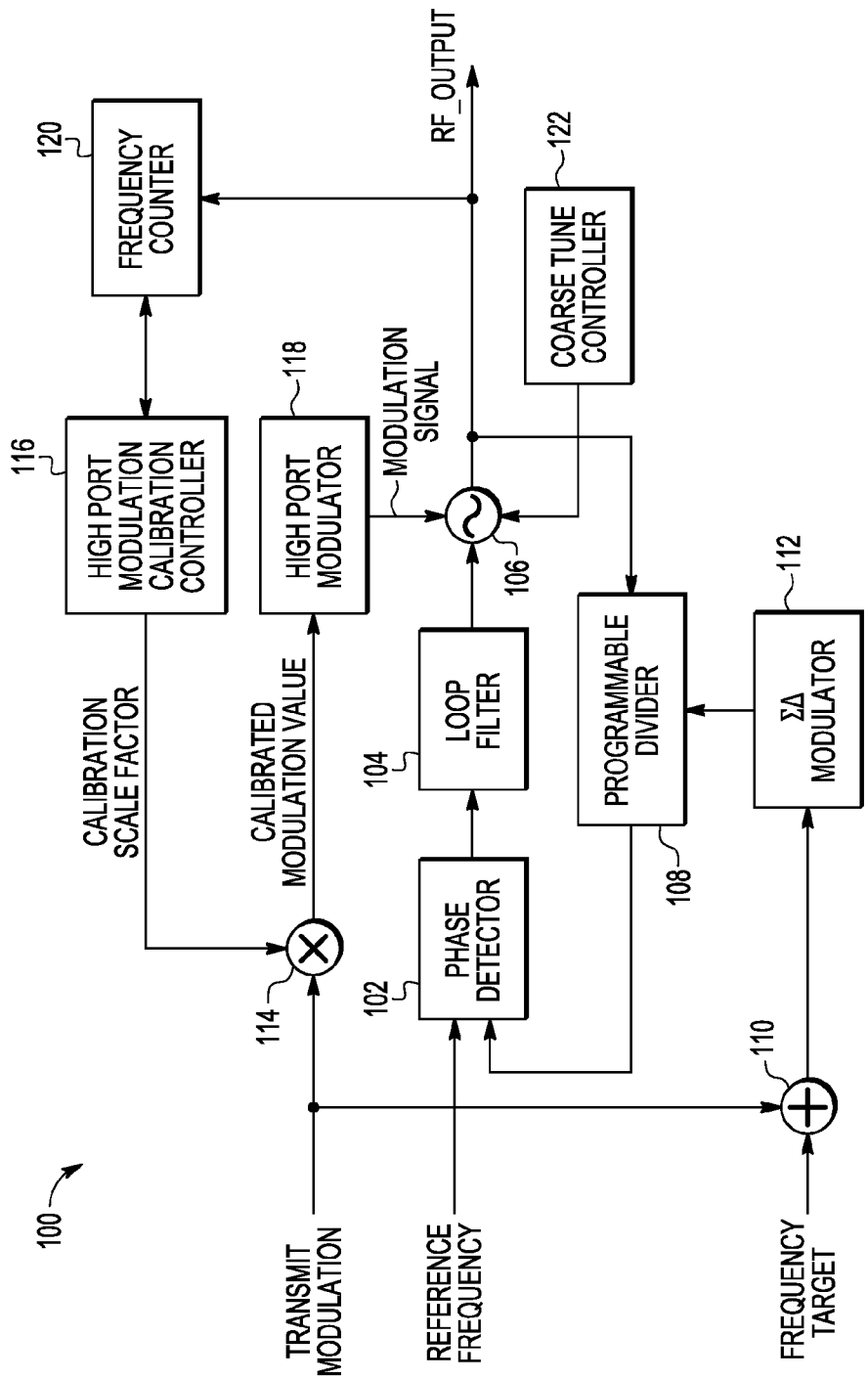
FIG. 1 is a block diagram of an embodiment of a phase locked loop (PLL).

FIG. 1 is a block diagram of an embodiment of PLL 100 that includes phase frequency detector 102, loop filter 104, voltage controlled oscillator (VCO) 106, programmable divider 108, summing junction 110, multiplication junction 114, high port modulation calibration controller 116, high port modulator 118, frequency counter 120, and coarse tune controller 122. VCO 106 generates an output signal (RF_OUTPUT), whose frequency is determined by signals from high port modulator 118 and loop filter 104 applied to inputs of VCO 106. Even though a voltage controlled oscillator is shown, other types of controlled oscillators might also be used. PLL 100 may be implemented as an integrated circuit in a semiconductor device and used in various types of electronic systems, such as a constant envelope transceiver, a polar radio transmitter, or other suitable device.

The RF_OUTPUT signal of the VCO 106 is sampled by a programmable divide 108 placed in a feedback path of the PLL 100. The frequency of the RF_OUTPUT signal is divided down by the programmable divide 108 and the divided signal is applied to an input of a phase frequency detector 102, where the phase is compared with the phase of a reference frequency applied to another input of the phase frequency detector 102. The reference frequency may be provided by a stable reference generator, for example a crystal oscillator. It should be noted that the phase frequency detector 102 could be designed to compare some other component of the signal such as frequency, or both frequency and phase.

Phase frequency detector 102 produces an error signal related to the difference in the phase and/or frequency of the compared signals and determines whether the operational frequency of input signals needs to be increased or decreased to match the phase of these input signals.

The output of phase frequency detector 102 is processed by loop filter 104, which may be, for example, a passive low pass filter, by attenuating high frequency components of the output of phase frequency detector 102. The output of phase frequency detector 102 processed by the loop filter 104 is then applied as a control input signal to the VCO 106, to control the frequency of the VCO output signal RF_OUTPUT. In this manner the RF_OUTPUT signal is phase locked to the stable reference frequency, meaning that the center frequency of the modulated signal does not change when the reference frequency remains constant. The RF_OUTPUT signal is provided to frequency counter 120 and programmable divider 108.

Input to sigma-delta modulator 112 is the sum of a target frequency and a transmit modulation signal provided by summing junction 110. Sigma-delta modulator 112 controls fractional division in programmable divider 108. Programmable divider 108 divides the RF_OUTPUT signal by an output from sigma-delta modulator 112. The divided frequency is compared with the reference frequency thereby forming a phase-locked loop. A fine analog control coming from loop filter 104 further tunes the output frequency of VCO 106. The calibrated modulation value can result in a high-port modulation frequency response at the output of VCO 106 that is complimentary to the low-port modulation frequency response at the output of VCO 106.

Frequency counter 120 determines the frequency of the RF_OUTPUT signal and provides the measured frequency to high port modulation calibration controller 116. The measured frequency is used to determine a scale factor that is provided to multiplication junction 114. The product of the transmit modulation input and the calibration scale factor from junction 114 is provided to high port modulator 118. A calibrated modulation is provided from high port modulator 118 to VCO 106 to reduce the error between the desired transmit modulation and RF_OUTPUT signal. High port modulation calibration controller 116 controls operation and reset of frequency counter 120 based on the operational mode and phase of operation within a given mode.

Coarse tune controller 122 can be used to calibrate VCO 106. During coarse tuning, coarse tune controller 122 can use a binary search or other suitable operation to tune VCO 106 to within a limit of a desired frequency. A frequency tuning adjustment from coarse tune controller 122 can be applied to VCO 106.

Figure 2:
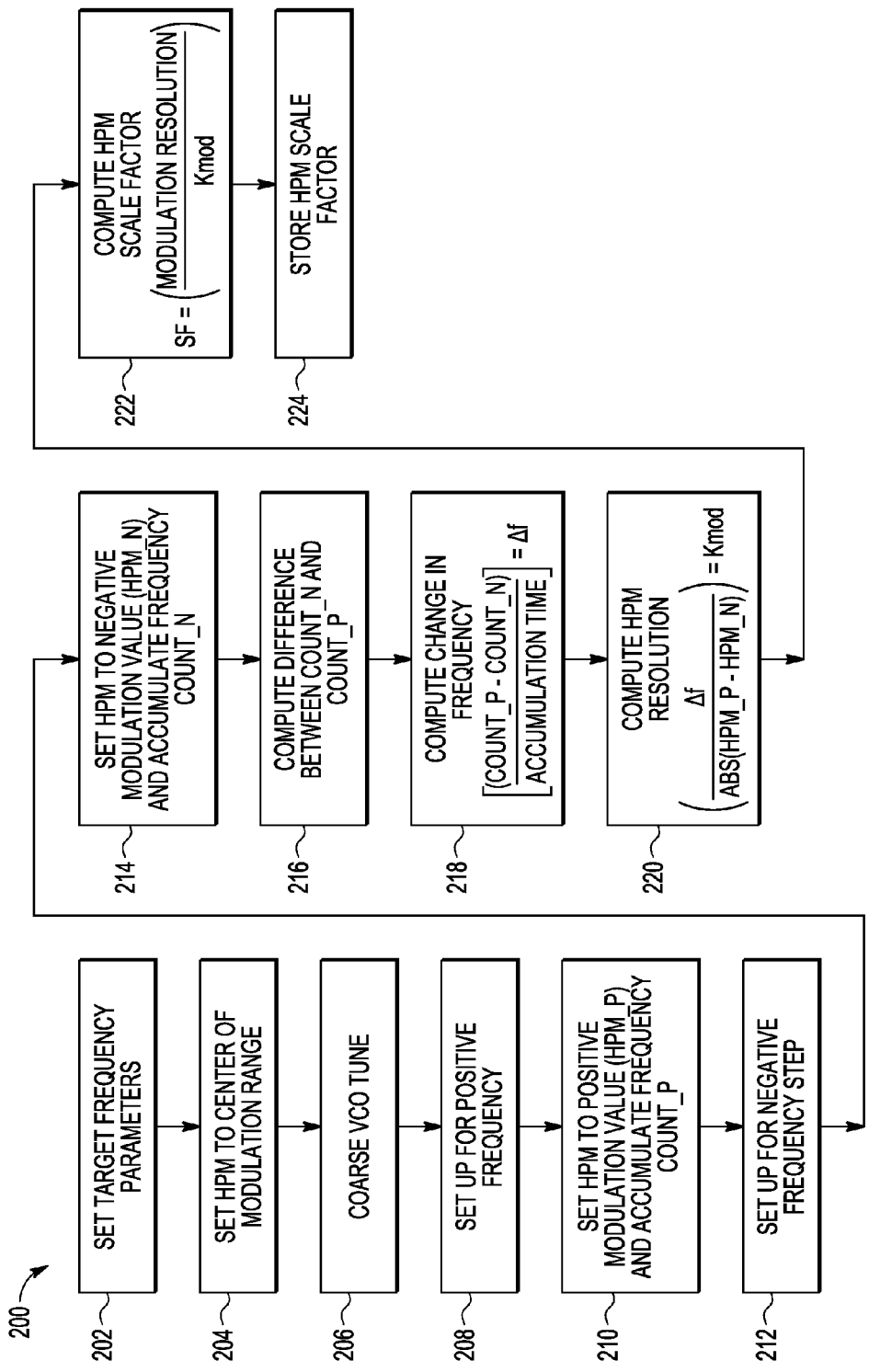
FIG. 2 is a flow diagram of a method for calibrating a high-port modulator of the PLL of FIG. 1.

Referring to FIGS. 1 and 2, FIG. 2 is a flow diagram of a method 200 for calibrating high-port modulator 118 of PLL 100 of FIG. 1. Process 202 includes setting desired frequency parameters such as a frequency target for coarse tuning. High-port modulator 118 can include a plurality of modulation steps, each modulation step corresponds to a frequency deviation in VCO output, and the calibration scale factor is configured to map one or more modulation steps to an accurate frequency deviation in VCO output. Process 204 includes setting high port modulation to a middle or center value of a modulation range. For example, if a varactor array in high port modulator 118 has 256 possible steps, a center value could be the modulation associated with a varactor setting at step 128.

Process 206 includes coarse tuning VCO 106. During coarse tuning, a binary search or other suitable operation can be used to tune VCO 106 to within a limit of the target frequency using the center modulation value.

Once the coarse tuning has been performed, process 208 includes waiting a predetermined amount of time sufficient to allow the coarse tuning settings time to settle. Frequency counter 120 can also be reset to an initial value, such as zero. Process 208 further includes setting up a positive step or value (HPM_P) of the modulation range that is above the center modulation value. For example, using a varactor array with 256 possible steps, the positive step could be set to value between 128 and 256. Process 210 includes setting high port modulation to the positive step value of the modulation range and determining the frequency (FREQ_P) of the RF_OUTPUT signal from VCO 106.

Once process 210 has been performed, process 212 includes waiting a predetermined amount of time sufficient to allow RF_OUTPUT time to settle. Frequency counter 120 can also be reset to an initial value, such as zero. Process 212 further includes setting up a negative step or value (HPM_N) of the modulation range that is below the center modulation value. For example, using a varactor array with 256 possible steps, the negative step could be set to value between 0 and 128. Process 214 includes setting high port modulation to the negative step value of the modulation range and determining the frequency (FREQ_N) of the RF_OUTPUT signal from VCO 106.

Once process 216 has been performed, process 218 includes computing the difference in frequency ($\Delta f$) of the RF_OUTPUT signal at the positive and negative modulation values, and dividing the difference by the time period used to determine the frequency, also referred to as accumulation time. When the negative measurement is taken before the positive measurement, the difference is the absolute frequency difference between two frequency deviation measurement points.

Process 220 includes computing the modulation resolution of high port modulator 118, which is the value of the least significant bit of the modulation range in modulator 118. The modulation resolution, also referred to as a gain (Kmod) of the modulator can be determined by dividing the change in frequency ($\Delta f$) by the absolute value of the difference between the positive value (HPM_P) of the modulation range and the negative value (HPM_N) of the modulation range.

Process 222 includes determining a calibration scale factor that is applied to the transmit modulation at multiplier junction 114. As an example, the calibration scale factor (SF) can be determined by dividing the low-port modulation resolution by the hi-port modulation resolution (Kmod). The low port resolution is typically equal to the reference frequency divided by $2^n$ where n is the number of digital bits in the low port command word. The calibration scale factor is used to calibrate the input modulation value to a calibrated modulation value that results in the output signal of VCO 106 having an accurate frequency deviation around a target frequency to which the PLL 100 is locked Process 224 includes storing the calibration scale factor in a table for access during normal operation. The scale factor is used to calibrate high port modulator 118 prior to each transmission, and since it can be calculated dynamically, the scale factor compensates for variations in process, voltage and temperature at the current operating conditions.

Figure 3:
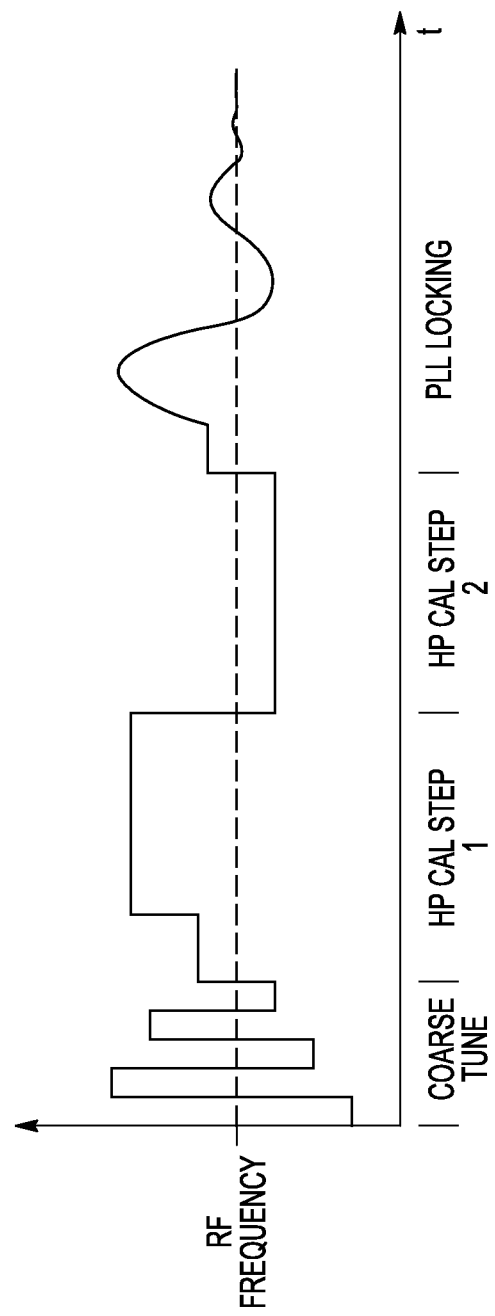
FIG. 3 is a time history diagram showing an example of four different time periods of operation during high port calibration of the PLL of FIG. 1.

Referring to FIGS. 1 and 3, FIG. 3 is a time history diagram showing an example of four different time periods of operation during calibration of high port modulator 118 of PLL 100 in FIG. 1. At the beginning of a coarse tune time period, a coarse tune operation is performed on VCO 106. A binary search or other suitable operation can be used during coarse tuning to tune VCO 106 to within a limit of the target frequency using the center modulation value.

At the start of a second time period, labeled as High Port (HP) Cal Step 1, high port modulator 118 is operated using the positive modulation value (HPM_P) selected in process 210 of FIG. 2.

At the start of a third time period, labeled as High Port (HP) Cal Step 2, high port modulator 118 is operated using the negative modulation value (HPM_N) selected in process 214 of FIG. 2. The frequency response of PLL 100 is measured by frequency counter 120 during High Port (HP) Cal Steps 1 and 2. The resulting difference between the positive and negative frequency points is used in a lookup table or by another suitable technique in high port modulation calibration controller 116 to determine a calibration scale factor that is used at multiplication junction 114 during subsequent operation of PLL 100.

A fourth time period then begins during which PLL 100 attempts to lock on the target frequency within an allowable tolerance. At the end of the fourth time period, PLL 100 determines whether PLL 100 has locked onto the target frequency. If the frequency lock operation is successful, transceiver 100 enters normal operation. If the frequency lock operation is not successful, a signal can be sent to a controller or processor (not shown) indicating that PLL 100 has failed to achieve frequency lock.

Figure 4:
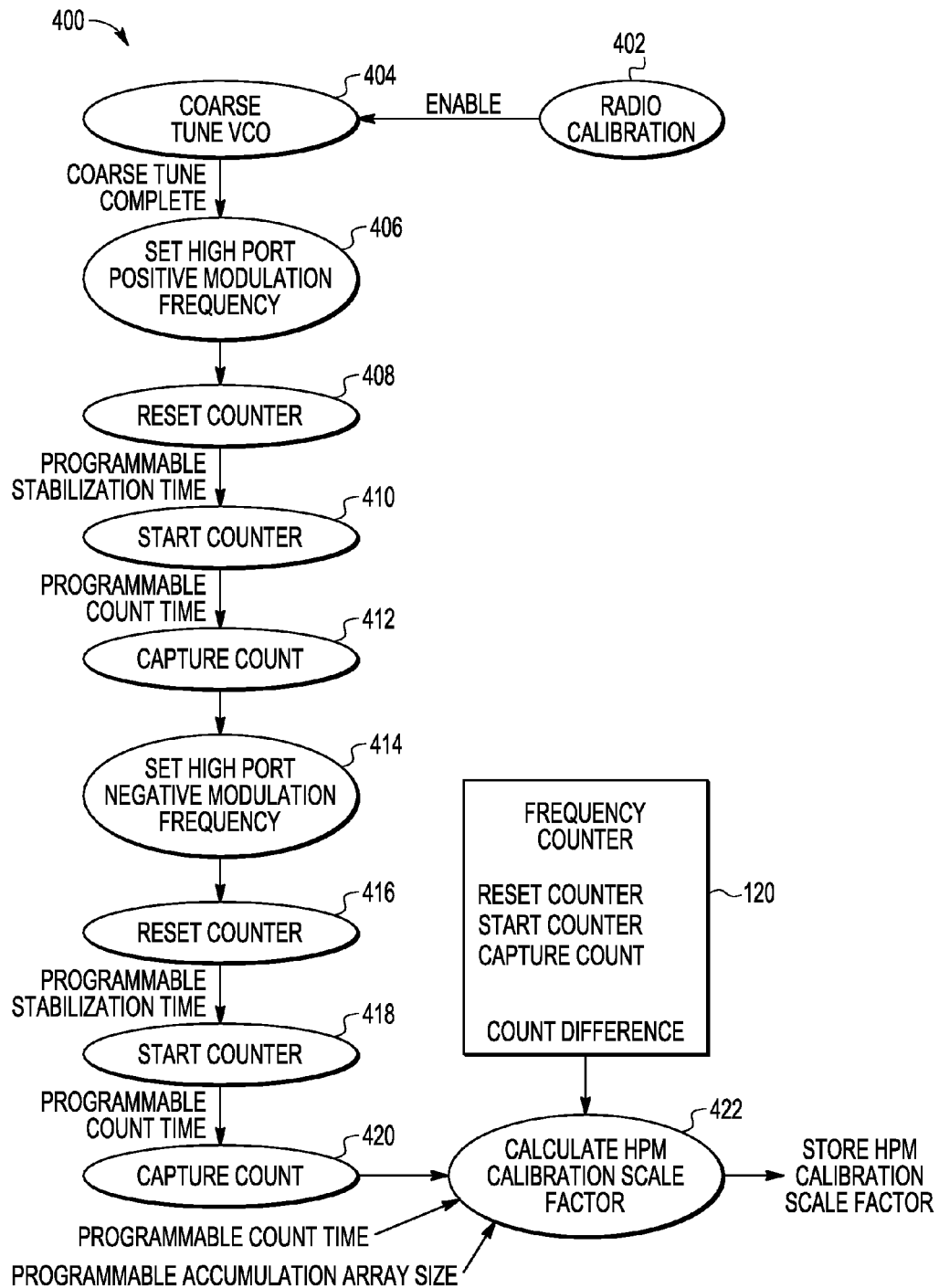
FIG. 4 is a state diagram of a high port modulation calibration controller that can be used in the PLL of FIG. 1.

FIG. 4 is a state diagram 400 of high port modulation calibration controller 116 that can be used in the PLL of FIG. 1. PLL 100 transitions from radio calibration wait state 402 to coarse tune VCO state 404 when a calibration enable signal is set. PLL 100 transitions from coarse tune VCO state 404 to state 406 to set the high port positive modulation frequency HPM_P when the coarse tuning is complete. State 406 transitions to state 408 to reset the positive frequency counter value (COUNT_P). After a programmable amount of time chosen to allow PLL 100 to stabilize, state 408 transitions to state 410 to start counting the frequency response of PLL 100 at the high port positive modulation frequency HPM_P. After a programmable of time chosen to count the positive modulation frequency HPM_P, state 410 transitions to state 412 to capture the positive modulation frequency HPM_P at the end of the counting time period.

PLL 100 transitions from state 412 to state 414 to set the high port negative modulation frequency HPM_N when the positive modulation frequency HPM_P has been captured. State 414 transitions to state 416 to reset the negative frequency counter value (COUNT_N). After a programmable amount of time chosen to allow PLL 100 to stabilize, state 416 transitions to state 418 to start counting the frequency response of PLL 100 at the high port negative modulation frequency HPM_N. After a programmable of time chosen to count the negative modulation frequency HPM_N, state 418 transitions to state 420 to capture the negative modulation frequency HPM_N at the end of the counting time period. After capturing the negative modulation frequency HPM_N state 420 transitions to state 422 to determine the high port modulation calibration scale factor using the count time, accumulation array size, and difference in count between the positive and negative frequency count values from frequency counter 120, as shown for example in processes 218 through 222 in FIG. 2.

Figure 5:
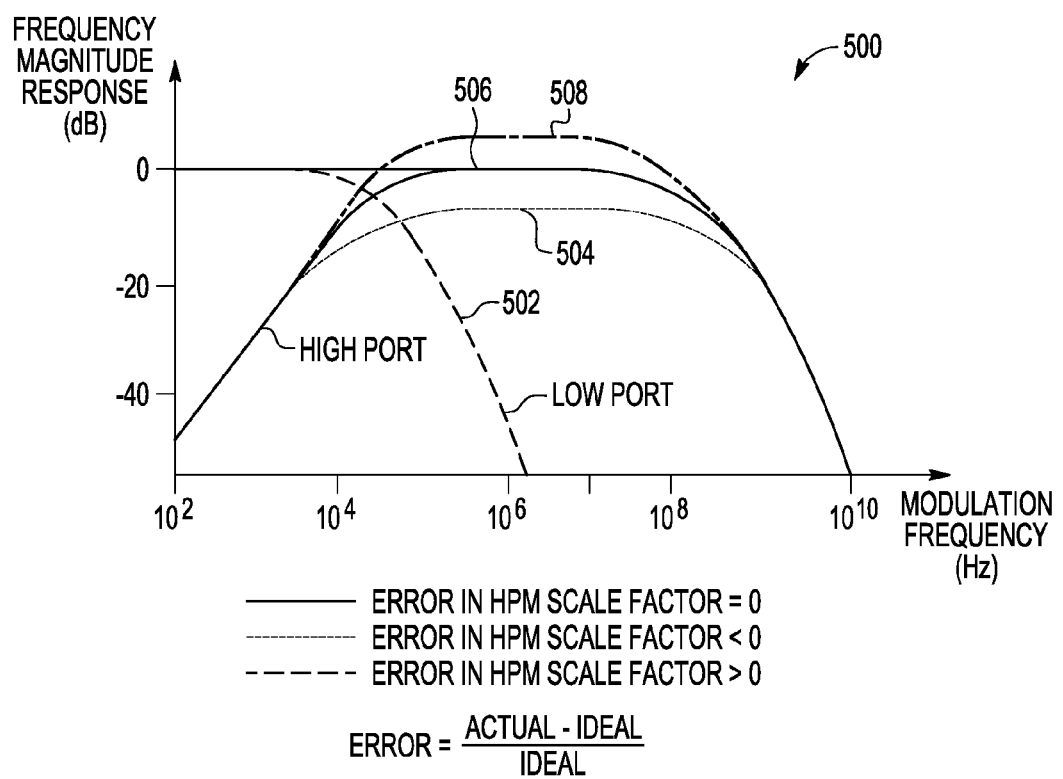
FIG. 5 is a diagram showing an example of a frequency response diagram for the dual port PLL of FIG. 1.

FIG. 5 is a diagram showing an example of a frequency response diagram 500 for high and low ports of PLL 100 of FIG. 1. One objective for PLL 100 is to reproduce the transmit modulation signal with no distortion. Note that FIG. 5 is not a traditional filter response where y-axis is signal amplitude response in dB and the x-axis represents the data path bandwidth. Rather the y-axis is the frequency magnitude response to a frequency command at the PLL input (with correct modulation scaling), while the x-axis is the bandwidth of the frequency modulation command.

Ideally, PLL 100 outputs a uniform (flat) frequency magnitude response at zero dB over the bandwidth of the modulation command in which PLL 100 is used. The zero dB line corresponds to the frequency deviation at the VCO output being equal to the product of the frequency commands to the PLL scaled by the modulation scaling factor. That is, there is no error in the reproduction of the desired frequency deviation at the PLL/VCO output. Note that the modulation scaling factors and resolutions will typically be different for low port and high port modulations Frequency response diagram 500 shows low port frequency response 502 at 0 dB magnitude at a modulation frequencies ranging from near DC (zero frequency) to approximately 10 kHz. At 10 kHz, response 502 exponentially decays from 0 dB to −50 dB at approximately 1000 kHz.

To handle frequencies above 10 kHz, high port modulation is used in PLL 100, with responses 504, 506 and 508 being shown for high port modulation with errors in the high port modulation scale factor being less than zero, equal to zero, and greater than zero. High port frequency responses 504, 506, 508 have a similar response at low modulation frequencies, varying linearly from −30 at modulation frequency of 100 Hz to approximately −20 dB to at modulation frequency of approximately 15 kHz. Between modulation frequencies of approximately 15 kHz to 160 kHz, responses 504, 506, 508 are non-linear, with response 504 reaching a steady response of approximately −8 dB, response 506 reaching a steady response of approximately 0 dB, and response 508 reaching a steady response of approximately 5 dB. Responses 504, 506, 508 remain at their respective steady state magnitudes until approximately 175 MHz where responses 504, 506, 508 reduce non-linearly to −60 dB at a modulation frequency of approximately 10 GHz.

Responses 504 and 508 indicate that without using a correct scale factor, distortion in the transmit modulation signal occurs, while a properly calibrated scale factor will eliminate distortion in the transmit modulation signal. The high port modulation calibration is performed before each transmission to determine the value of the scale factor at the current transmit frequency and PVT conditions.

The HPM calibration factor can be determined in two-steps by setting the HPM capacitor array to the minimum and maximum ranges and counting for a period of time at each range. The resulting count difference can be used in a lookup table to determine the HPM calibration factor. Note that in some cases, a subset of a modulation array in high port modulator 118 can be used for the calibration. In such a scenario the min/max range of the calibration would not correspond to the ends of the modulation array.

By now it should be appreciated that in some embodiments there has been provided a phase-locked loop (PLL) (100) for a constant envelope modulation transmitter that can include a voltage-controlled oscillator (VCO) (106) configured to generate an output signal having variable frequency, a high port modulator (118) configured to inject a modulation signal (digital or analog/current or voltage/DAC) into the VCO based on an input modulation value, and a high port calibration control module (116) configured to calibrate (208) the input modulation value to a first modulation value that results in the output signal having a positive frequency change from an initial output frequency, capture (210) a positive frequency value of the output signal after a first accumulation time period, calibrate (212) the input modulation value to a second modulation value that results in the output signal having a negative frequency change from the initial output frequency, capture (214) a negative frequency value of the output signal after a second accumulation time period, and calculate a calibration scale factor based on a difference between the positive and negative frequency values.

In another aspect, the high-port modulator can include a plurality of modulation steps, each modulation step can correspond to a frequency deviation in VCO output, and the calibration scale factor can be configured to map one or more modulation steps to an accurate frequency deviation in VCO output.

In another aspect, the calibration scale factor can be configured to calibrate the input modulation value to a calibrated modulation value that results in the output modulation signal of the VCO having an accurate frequency deviation around a target frequency to which the PLL is locked.

In another aspect, the PLL can further comprise a sigma-delta modulator (112) configured to receive a low-port modulation value that results in a low-port modulation frequency response at VCO output, and the calibrated modulation value results in a high-port modulation frequency response at VCO output that is complimentary to the low-port modulation frequency response at VCO output.

In another aspect, the high port calibration control module (116) can be configured to calculate the calibration scale factor by being further configured calculate (216) a change in modulation value (|HPM_P-HPM_N|) equal to a difference between the first and second modulation values, calculate (218) a change in output frequency ($\Delta f$) equal to a difference between the positive and negative frequency values, calculate (220) calibration resolution (Kmod) equal to the change in output frequency divided by the change in modulation value, and calculate (222) the calibration scale factor (SF) equal to a low-port modulation resolution divided by the calibration resolution (Kmod or high-port modulation resolution). The low-port modulation resolution can be equal to a reference frequency divided by base 2 raised to a number of modulation steps available in a low-port modulator (e.g., number of bits in a low-port command word provided to sigma-delta modulator).

In another aspect, the PLL can further comprise a frequency counter (120) configured to record a frequency value of the output signal, and the high-port calibration control module is configured to capture the positive and negative frequency values by being further configured to read a first count (COUNT_P) accumulated by the frequency counter during the first accumulation time period. The positive frequency value can be equal to the first count divided by the accumulation time period, and read a second count (COUNT_N) accumulated by the frequency counter during the second accumulation time period. The negative frequency value can be equal to the second count divided by the second accumulation time period.

In another aspect, the PLL can further comprise a coarse tune calibration module configured to coarse tune (206) the VCO that results in the initial output frequency being within a frequency threshold of a target frequency, and the high port calibration control module can be further configured to calibrate (204) the input modulation value to a center modulation value prior to the coarse tune. The center modulation value can be between the first and second modulation values, and the coarse tune can be performed prior to calibration of the input modulation value to the first and second modulation values.

In another aspect, a first plurality of modulation steps between the center modulation value and the first modulation value can be equal to a second plurality of modulation steps between the center modulation value and the second modulation value.

In another aspect, a first plurality of modulation steps between the center modulation value and the first modulation value may not be equal to a second plurality of modulation steps between the center modulation value and the second modulation value.

In another aspect, the first modulation value and the second modulation value can be separated by a plurality of modulation steps, and the plurality of modulation steps can comprise up to a maximum number of modulation steps available in the high port modulator.

In another aspect, the high port calibration control module can be further configured to calculate a plurality of frequency scale factors associated with the calibration scale factor. Each of the plurality of frequency scale factors can correspond to one of a plurality of reference frequencies, each of the plurality of reference frequencies can be configured to be utilized as an input control frequency to the VCO and store the plurality of frequency scale factors in a lookup table.

In another aspect, the difference between the positive and negative frequency values and a present reference frequency of the VCO can be used to perform a lookup for an associated calibration scale factor and an associated frequency scale factor in the lookup table.

In another aspect, the high port modulator can comprise one of a group consisting of a digital-to-analog converter (DAC) and a bank of switchable varactors.

In another aspect, the modulation signal comprises a plurality of signals.

In another embodiment, an integrated circuit device can comprise a transmitter including a phase-locked loop (PLL) that can include a high port calibration control module (116) configured to calibrate (208) an input modulation value of a voltage-controlled oscillator (VCO) to a first modulation value that results in an output signal of the VCO having a positive frequency change from an initial output frequency, capture (210) a positive frequency value of the output signal after a first accumulation time period, calibrate (212) the input modulation value of the VCO to a negative second modulation value that results in the output signal having a negative frequency change from the initial output frequency, capture (214) a negative frequency value of the output signal after a second accumulation time period, and calculate a calibration scale factor based on a difference between the positive and negative frequency values.

In another aspect, the calibration scale factor can be configured to calibrate the input modulation value to a calibrated modulation value that results in the output signal of the VCO having an accurate frequency deviation around a target frequency to which the PLL is locked.

In another aspect, the PLL can further comprise a sigma-delta modulator (112) configured to receive a low-port modulation value that results in a low-port modulation frequency response at VCO output. The calibrated modulation value can result in a high-port modulation frequency response at VCO output that is complimentary to the low-port modulation frequency response at VCO output.

In another aspect, the PLL can be further configured to calculate (216) a change in modulation value (|HPM_P-HPM_N|) equal to a difference between the first and second modulation values, calculate (218) a change in output frequency ($\Delta f$) equal to a difference between the positive and negative frequency values, calculate (220) calibration resolution (Kmod) equal to the change in output frequency divided by the change in modulation value, and calculate (222) the calibration scale factor (SF) equal to a low-port modulation resolution divided by the calibration resolution (Kmod or high-port modulation resolution). The low-port modulation resolution can be equal to a reference frequency divided by base 2 raised to a number of modulation steps available in a low-port modulator (e.g., number of bits in a low-port command word provided to sigma-delta modulator).

In further embodiments, a method for operating a phase-locked look (PLL) can comprise calibrating (208) an input modulation value of a voltage-controlled oscillator (VCO) of the PLL to a first modulation value that results in an output signal of the VCO having a positive frequency change from an initial output frequency, capturing (210) a positive frequency value of the output signal after a first accumulation time period, calibrating (212) the input modulation value of the VCO to a negative second modulation value that results in the output signal having a negative frequency change from the initial output frequency, capturing (214) a negative frequency value of the output signal after a second accumulation time period, and calculating a calibration scale factor based on a difference between the positive and negative frequency values.

In another aspect, calculating the calibration scale factor can further comprise calculating (216) a change in modulation value (|HPM_P-HPM_N|) equal to a difference between the first and second modulation values, calculating (218) a change in output frequency ($\Delta f$) equal to a difference between the positive and negative frequency values, calculating (220) calibration resolution (Kmod) equal to the change in output frequency divided by the change in modulation value, and calculating (222) the calibration scale factor (SF) equal to a low-port modulation resolution divided by the calibration resolution (Kmod or high-port modulation resolution). The low-port modulation resolution can be equal to a reference frequency divided by base 2 raised to a number of modulation steps available in a low-port modulator (e.g., number of bits in a low-port command word provided to sigma-delta modulator).

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the disclosure. Of course, the description of the architecture has been simplified for purposes of discussion, and it is just one of many different types of appropriate architectures that may be used in accordance with the disclosure. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A phase-locked loop (PLL) comprising:
a voltage-controlled oscillator (VCO) configured to generate an output signal having variable frequency;
a high-port modulator coupled to the VCO, the high-port modulator configured to inject a modulation signal into the VCO, based on an input modulation value; and
a high-port calibration control module configured to
calibrate the input modulation value to a first modulation value that results in the output signal having a positive frequency change from an initial output frequency,
capture a positive frequency value of the output signal after a first accumulation time period,
calibrate the input modulation value to a second modulation value that results in the output signal having a negative frequency change from the initial output frequency,
capture a negative frequency value of the output signal after a second accumulation time period,
calculate a calibration scale factor based on a difference between the positive and negative frequency values,
calculate a plurality of frequency scale factors associated with the calibration scale factor, wherein
each of the plurality of frequency scale factors corresponds to one of a plurality of reference frequencies, and each of the plurality of reference frequencies are configured to be utilized as an input control frequency to the VCO, and
store the plurality of frequency scale factors and the calibration scale factor in a lookup table.

2. The PLL of claim 1, wherein
the high-port modulator includes a plurality of modulation steps,
each modulation step corresponds to a frequency deviation in VCO output, and
the calibration scale factor is configured to map one or more modulation steps to an accurate frequency deviation in VCO output.

3. The PLL of claim 1, wherein the calibration scale factor is configured to calibrate the input modulation value to a calibrated modulation value that results in the output signal of the VCO having an accurate frequency deviation around a target frequency to which the PLL is locked.

4. The PLL of claim 3, wherein
the PLL further comprises a sigma-delta modulator configured to receive a low-port modulation value that results in a low-port modulation frequency response at VCO output, and
the calibrated modulation value results in a high-port modulation frequency response at VCO output that is complimentary to the low-port modulation frequency response at VCO output.

5. The PLL of claim 1, wherein the high-port calibration control module is configured to calculate the calibration scale factor by being further configured to:
calculate a change in modulation value equal to a difference between the first and second modulation values;
calculate a change in output frequency equal to a difference between the positive and negative frequency values;
calculate calibration resolution equal to the change in output frequency divided by the change in modulation value; and
calculate the calibration scale factor equal to a low-port modulation resolution divided by the calibration resolution,
wherein the low-port modulation resolution is equal to a reference frequency divided by base 2 raised to a number of modulation steps available in a low-port modulator.

6. The PLL of claim 1, wherein
the PLL further comprises a frequency counter configured to record a frequency value of the output signal, and
the high-port calibration control module is configured to capture the positive and negative frequency values by being further configured to
read a first count accumulated by the frequency counter during the first accumulation time period, wherein the positive frequency value is equal to the first count divided by the accumulation time period, and
read a second count accumulated by the frequency counter during the second accumulation time period, wherein the negative frequency value is equal to the second count divided by the second accumulation time period.

7. The PLL of claim 1, wherein
the PLL further comprises a coarse tune calibration module configured to coarse tune the VCO that results in the initial output frequency being within a frequency threshold of a target frequency, and
the high-port calibration control module is further configured to calibrate the input modulation value to a center modulation value prior to the coarse tune, wherein the center modulation value is between the first and second modulation values, and the coarse tune is performed prior to calibration of the input modulation value to the first and second modulation values.

8. The PLL of claim 7, wherein a first plurality of modulation steps between the center modulation value and the first modulation value is equal to a second plurality of modulation steps between the center modulation value and the second modulation value.

9. The PLL of claim 7, wherein a first plurality of modulation steps between the center modulation value and the first modulation value is not equal to a second plurality of modulation steps between the center modulation value and the second modulation value.

10. The PLL of claim 1, wherein the first modulation value and the second modulation value are separated by a plurality of modulation steps, and the plurality of modulation steps comprises up to a maximum number of modulation steps available in the high-port modulator.

11. The PLL of claim 1, wherein the difference between the positive and negative frequency values and a present reference frequency of the VCO are used to perform a lookup for an associated calibration scale factor and an associated frequency scale factor in the lookup table.

12. The PLL of claim 1, wherein the high-port modulator comprises at least one of a digital-to-analog converter (DAC) and a bank of switchable varactors.

13. The PLL of claim 1, wherein the modulation signal comprises a plurality of signals.

14. A semiconductor device comprising:
a phase-locked loop (PLL) comprising:
a high-port calibration control module configured to
calibrate an input modulation value of a voltage-controlled oscillator (VCO) to a first modulation value that results in an output signal of the VCO having a positive frequency change from an initial output frequency,
capture positive frequency value of the output signal after a first accumulation time period,
calibrate the input modulation value of the VCO to a second modulation value that results in the output signal having a negative frequency change from the initial output frequency,
capture a negative frequency value of the output signal after a second accumulation time period, and
calculate a calibration scale factor based on a difference between the positive and negative frequency values, including
calculate a change in modulation value equal to a difference between the first and second modulation values;
calculate a change in output frequency equal to a difference between the positive and negative frequency values;
calculate calibration resolution equal to the change in output frequency divided by the change in modulation value; and
calculate the calibration scale factor equal to a low-port modulation resolution divided by the calibration resolution,
wherein the low-port modulation resolution is equal to a reference frequency divided by base 2 raised to a number of modulation steps available in a low-port modulator.

15. The semiconductor of claim 14, wherein the calibration scale factor is configured to calibrate the input modulation value to a calibrated modulation value that results in the output signal of the VCO having an accurate frequency deviation around a target frequency to which the PLL is locked.

16. The semiconductor device of claim 15, wherein
the PLL further comprises a sigma-delta modulator configured to receive a low-port modulation value that results in a low-port modulation frequency response at VCO output, and
the calibrated modulation value results in a high-port modulation frequency response at VCO output that is complimentary to the low-port modulation frequency response at VCO output.

17. A method for operating a phase-locked loop (PLL) comprising:
calibrating an input modulation value of a voltage-controlled oscillator (VCO) of the PLL to a first modulation value that results in an output signal of the VCO having a positive frequency change from an initial output frequency,
capturing a positive frequency value of the output signal after a first accumulation time period,
calibrating the input modulation value of the VCO to a second modulation value that results in the output signal having a negative frequency change from the initial output frequency,
capturing a negative frequency value of the output signal after a second accumulation time period, and
calculating a calibration scale factor based on a difference between the positive and negative frequency values, including:
calculating a change in modulation value equal to a difference between the first and second modulation values;
calculating a change in output frequency equal to a difference between the positive and negative frequency values;
calculating calibration resolution equal to the change in output frequency divided by the change in modulation value; and
calculating the calibration scale factor equal to a low-port modulation resolution divided by the calibration resolution,
wherein the low-port modulation resolution is equal to a reference frequency divided by base 2 raised to a number of modulation steps available in a low-port modulator.

* * * * *